(12) United States Patent
    Li

(10) Patent No.: US 12,400,943 B2
(45) Date of Patent: Aug. 26, 2025

(54) SIGNAL TRACE CONFIGURATION TO REDUCE CROSS TALK

(71) Applicant: Intel Corporation, Santa Clara, CA (US)

(72) Inventor: Xiang Li, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 862 days.

(21) Appl. No.: 17/326,946

(22) Filed: May 21, 2021

(65) Prior Publication Data

US 2021/0327799 A1    Oct. 21, 2021

(51) Int. Cl.
| | |
|---|---|
| *H01L 23/498* | (2006.01) |
| *H01L 21/48* | (2006.01) |
| *H01L 23/00* | (2006.01) |
| *H01L 25/00* | (2006.01) |

(Continued)

(52) U.S. Cl.
CPC .... *H01L 23/49838* (2013.01); *H01L 21/4853* (2013.01); *H01L 23/49816* (2013.01); *H01L 24/16* (2013.01); *H01L 25/0655* (2013.01); *H01L 25/18* (2013.01); *H01L 25/50* (2013.01); *H01L 2224/16227* (2013.01); *H01L 2924/1431* (2013.01); *H01L 2924/1432* (2013.01); *H01L 2924/1434* (2013.01); *H01L 2924/15311* (2013.01); *H01L 2924/30107* (2013.01)

(58) Field of Classification Search
CPC .......... H01L 23/49838; H01L 21/4853; H01L 23/49816; H01L 24/16; H01L 25/0655; H01L 25/18; H01L 2224/16227; H01L 2924/1431; H01L 2924/1432; H01L 2924/1434; H01L 2924/15311; H05K 1/0243; H05K 1/0251; H05K 1/113
See application file for complete search history.

(56) References Cited

U.S. PATENT DOCUMENTS 6,362,525 B1   3/2002   Rahim
9,245,835 B1   1/2016   Jiang et al.
(Continued)

FOREIGN PATENT DOCUMENTS

EP    2290687 A1    3/2011

OTHER PUBLICATIONS

"Ball Grid Array (BGA) Packaging", Intel, 2000 Packaging Databook, Feb. 25, 2000, 32 pages.
(Continued)

*Primary Examiner* — Thanh Y. Tran
(74) *Attorney, Agent, or Firm* — Compass IP Law PC

(57) ABSTRACT

Examples described herein relate to an apparatus comprising: a trace comprising a portion routed at least 180 degrees around a perimeter of a pad, wherein the portion is coupled to the pad. In some examples, wherein a cross-sectional shape of the portion routed at least 180 degrees around a perimeter of the pad is one or a combination of: circular, elliptical, square, rectangle, or triangular. In some examples, wherein the portion routed at least 180 degrees around a perimeter of the pad is to increase package inductance and reduce a magnitude of far end cross talk (FEXT). In some examples, wherein the portion routed at least 180 degrees around a perimeter of the pad comprises one or more of: copper, bronze, or an alloy.

11 Claims, 9 Drawing Sheets

(51) Int. Cl.
*H01L 25/065* (2023.01)
*H01L 25/18* (2023.01)

(56) References Cited

U.S. PATENT DOCUMENTS

| | | | |
|---|---|---|---|
| 2009/0166846 A1* | 7/2009 | Pratt | H01L 21/76898 |
| | | | 257/E23.18 |
| 2009/0188711 A1* | 7/2009 | Ahmad | H05K 1/0248 |
| | | | 174/262 |
| 2010/0096725 A1* | 4/2010 | Shi | H01L 23/645 |
| | | | 257/E23.023 |
| 2012/0267756 A1 | 10/2012 | Shi et al. | |
| 2019/0067169 A1* | 2/2019 | Yu | H01L 21/56 |
| 2019/0150271 A1* | 5/2019 | Azadzoi | H05K 1/0219 |
| | | | 333/238 |

OTHER PUBLICATIONS

Extended European Search Report for Patent Application No. 22161812.7, Mailed Sep. 2, 2022, 8 pages.

* cited by examiner

SIGNAL TRACE CONFIGURATION TO REDUCE CROSS TALK

Volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein can be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory, JESD325, originally published by JEDEC in October 2013, DDR5 (DDR version 5, currently in discussion by JEDEC), LPDDR5 (currently in discussion by JEDEC), HBM2 (HBM version 2), currently in discussion by JEDEC, or others or combinations of memory technologies, and technologies based on derivatives or extensions of such specifications.

FIG. 1 shows an example package interconnect. The package interconnect 102 can be used to mount a DDR5 consistent memory component 110 on a printed circuit board (PCB) substrate 100 to a ball grid array (BGA) of balls 112. Memory component 110 can include at least one or more of: a DRAM memory device, a data buffer, a register clock driver (RCD), and interfaces compatible with DDR5. One or more of balls 112 can connect the memory component die 110 to another device such as a processor or other device. Crosstalk can occur between signals transmitted by different conductors. Crosstalk can cause interference between such signals and lead to distortion of a transmitted signal and modification of signals such that received signals are not properly decoded.

A DDR5 semiconductor package can use a flip chip to replace a wire bond connection to attempt to reduce crosstalk. Multiple layers can be used to route traces and a Plated Through Hole (PTH) transition can be used to connect traces between traces in different layers. FIG. 2 shows an example routing of connection of a bump to a ball of a BGA. Bump 206 can be coupled through portions of trace 200 and PTH 204 to ball 202. However, due to package size limitation and layer count limitation, the crosstalk between signals can be too large and reduce data transmission bandwidth, degrade signal transition clarity, and/or lead to inaccurate data reads or writes.

FIG. 3 shows an example of far end cross talk (FEXT) in the time domain. As shown in FIG. 3, an expression for far end crosstalk is expressed as a constant (K) multiplied by capacitive crosstalk ($C_M/C$) reduced by inductive crosstalk ($L_M/L$). In some cases, a DDR5 package has more inductive crosstalk than capacitive crosstalk and for an amount of time, the FEXT is negative.

DETAILED DESCRIPTION

Various technologies described herein provide a routing signal trace structure to reduce crosstalk. For example, a first trace can include a first coil and the first coil surrounds a portion of a first pad that is coupled to the first trace. For example, the first coil can encircle 180 degrees or more of the first pad. The first coil can be constructed of the same or different material as that of the first trace. For example, a second trace can include a second coil and the second coil can surround a portion of a second pad. The second coil can be constructed of the same or different material at that of the second trace. Combined or individually, the first coil and/or second coil can reduce inductance contribution to FEXT at signals transmitted from or received at the first pad and/or the second pad. One or more of the first and second coils can have cross sections that are circular, elliptical, square, rectangular, or triangular. The trace and second trace can be formed of conductive material that conducts or transfers electrical signals.

Figure 1:
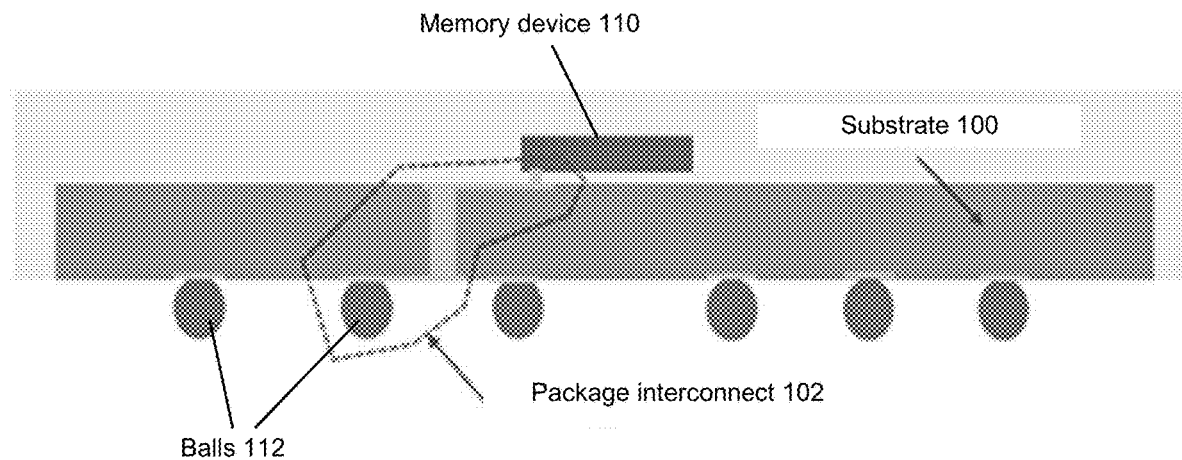
FIG. 1 shows an example package interconnect.
Figure 2:
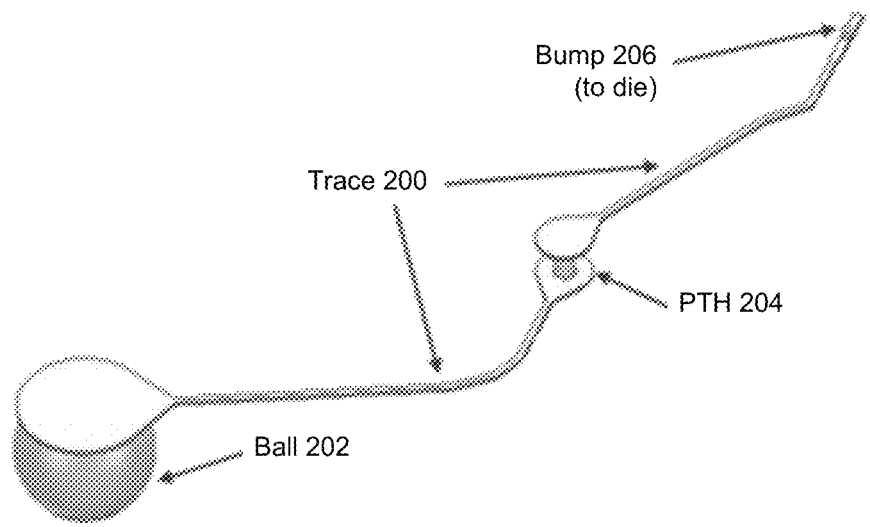
FIG. 2 shows an example routing of connection of a bump to a ball of a ball grid array (BGA).
Figure 3:
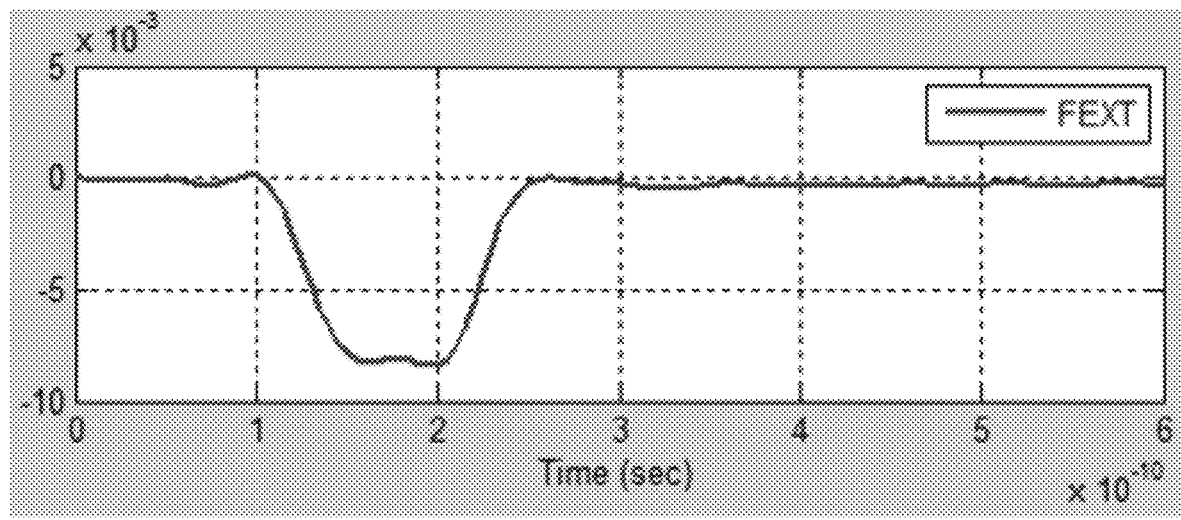
FIG. 3 shows an example of far end cross talk (FEXT) in the time domain.
Figure 4:
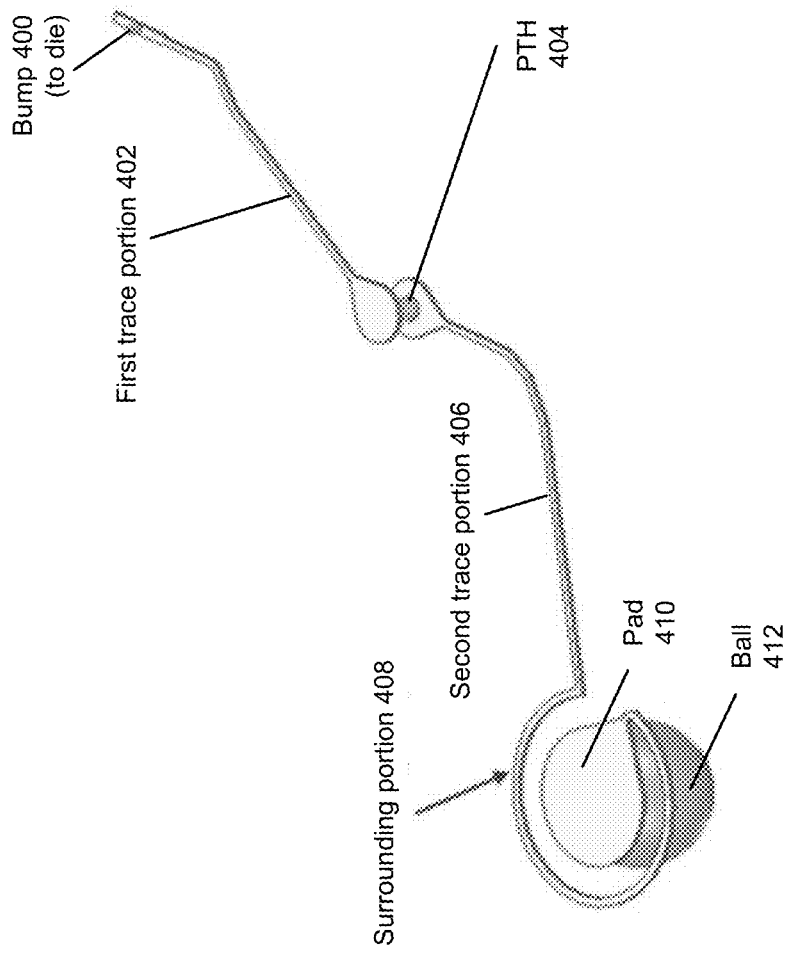
FIG. 4 depicts an example of a trace.

FIG. 4 depicts an example of a trace. First trace portion 402 can be connected to a bump 400 and to PTH 404. PTH 404 can provide a connection and conductive coupling between first trace portion 402 and second trace portion 406. A coil or surrounding portion 408 can be coupled to second trace portion 406 and pad 410. Surrounding portion 408 can be routed around a ball grid array (BGA) pad 410 at least 180 degree although other angles can be used and within a same plane as that of pad 410. A shape of the surrounding portion 408 can be circular, square or other shapes. A coil or surrounding portion 408 can increase the inductance (L) to reduce the inductive term ($L_M/L$) and reduce FEXT between signals transmitted in different traces at least in a DDR5 package, or other types of memory standards (e.g., DDRx, where x is an integer). Reduced DDR5 package crosstalk can improve DDR5 data transmission rates and reduce signal corruption to provide accurate transfer of data via signals.

Figure 5A:
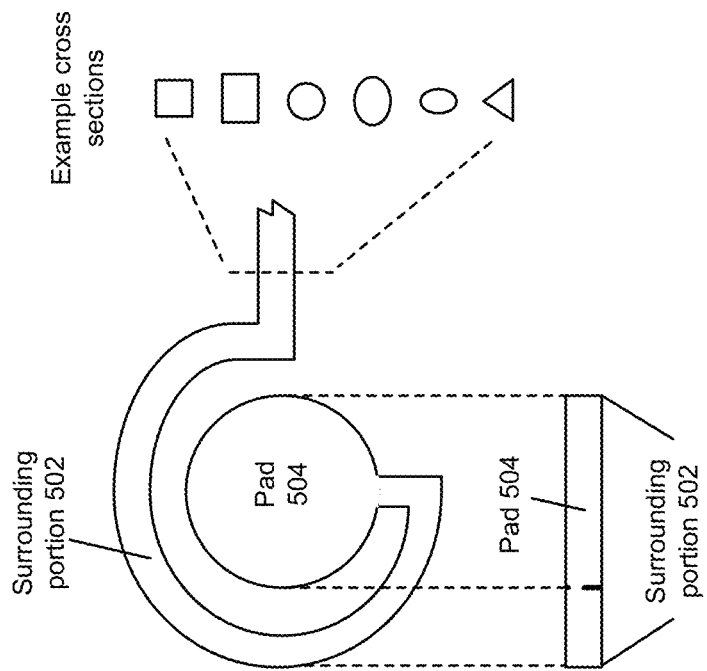
FIG. 5A depicts an example top view and cross sectional view of a trace routing around a portion of a pad.

FIG. 5A depicts an example top view and cross sectional views of a trace routing around a portion of a pad. Surrounding portion 502 can encircle 270 degrees around pad 504, although other angles can be used such as 180 degrees or more. Surrounding portion 502 can be planar to pad 504 and be positioned within the same X-Y plane. A cross section of surrounding portion 502 can be square, rectangular, circular, elliptical, triangular, or combination thereof. A width of surrounding portion 502 can be 2 mil, although other thicknesses can be used.

Figure 5B:
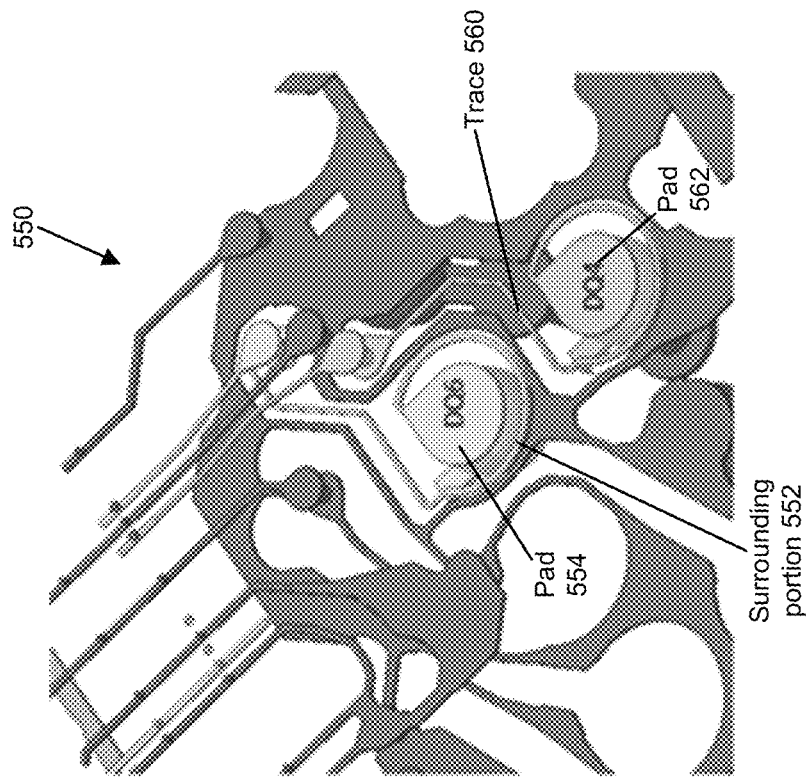
FIG. 5B depicts a package design.
Figure 5B:
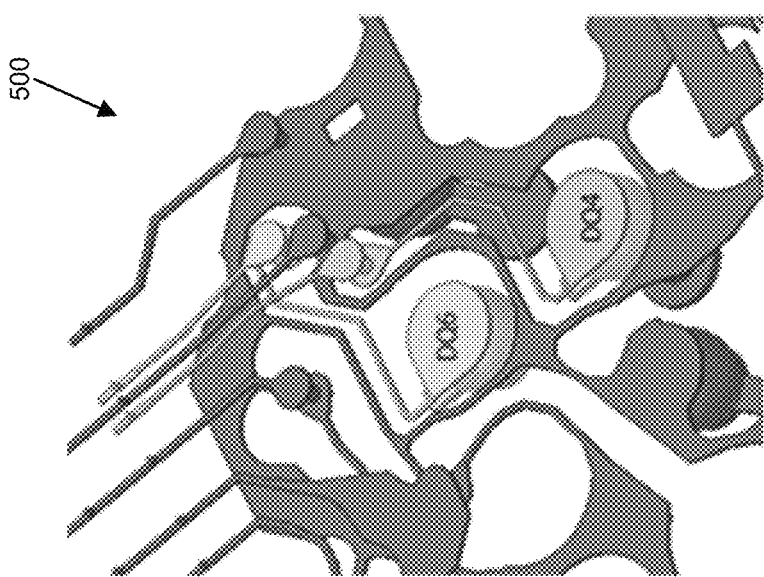

FIG. 5B depicts a DDR5 DRAM package design. In system 500, a first trace is connected to first BGA pad (data line DQ6) and a second trace is connected to a second BGA pad (data line DQ4). In system 550, surrounding portion 552 of a trace can be routed to encircle or surround 180 degrees or more around a BGA pad 554 (data line DQ6). Surrounding portion 552 can be positioned between pad 554 and trace 560 connected to BGA pad 562 (data line DQ4). Surrounding portion 552 can assist with reducing FEXT among signals transmitted to or received from pad 554 and signals transmitted to or received from pad 562.

Figure 6A:
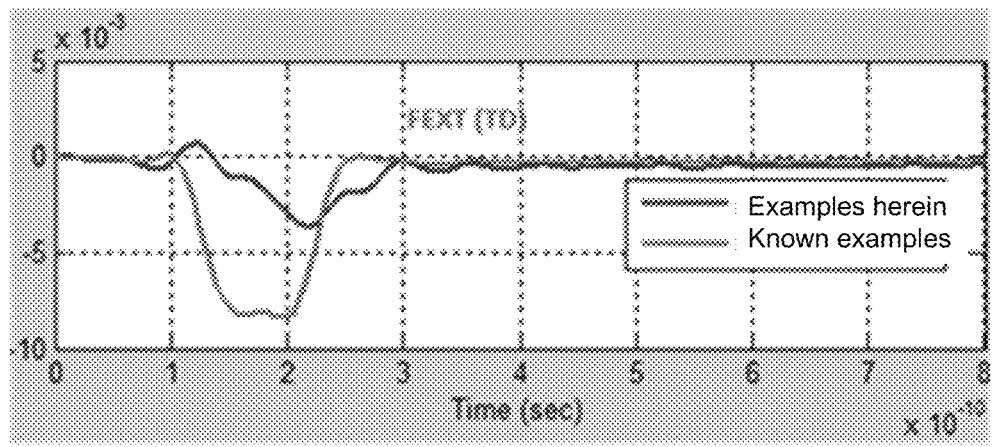
FIG. 6A shows a FEXT comparison in the time domain.

FIG. 6A shows a FEXT comparison in the time domain. As described earlier, FEXT can be expressed as $K(C_M/C - L_M/L)$. Increasing inductance by use of a surrounding trace portion can reduce $L_M/L$, regardless of change in $C_M/C$. Reducing $L_M/L$ can reduce a negative value contribution of $L_M/L$, thereby decreasing FEXT between signals transmitted over different traces.

Figure 6B:
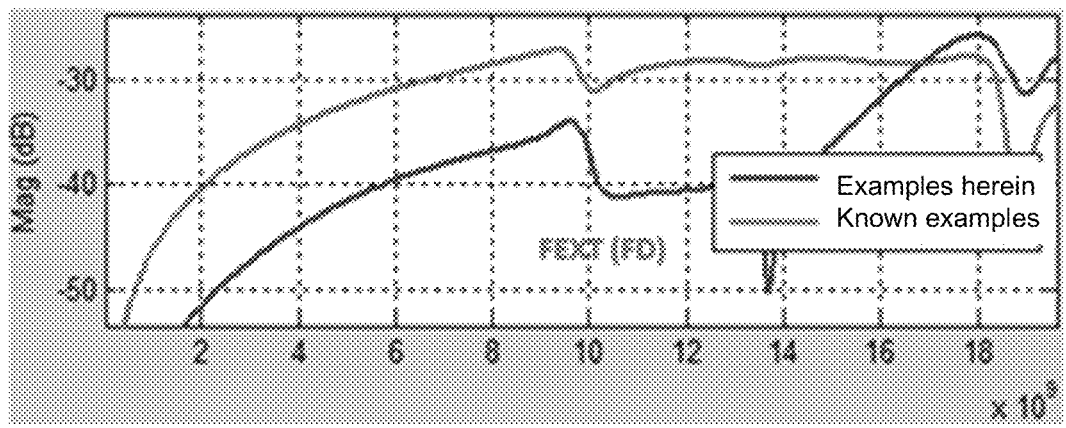
FIG. 6B shows a comparison of frequency domain FEXT where the X axis indicates frequency of a transmitted signal and the Y axis indicates magnitude of FEXT.

FIG. 6B shows a comparison of frequency domain FEXT where the X axis indicates frequency of a transmitted signal and the Y axis indicates magnitude of FEXT. Accordingly, use of one or more surrounding traces can reduce FEXT among signals transmitted on different traces.

Figure 7A:
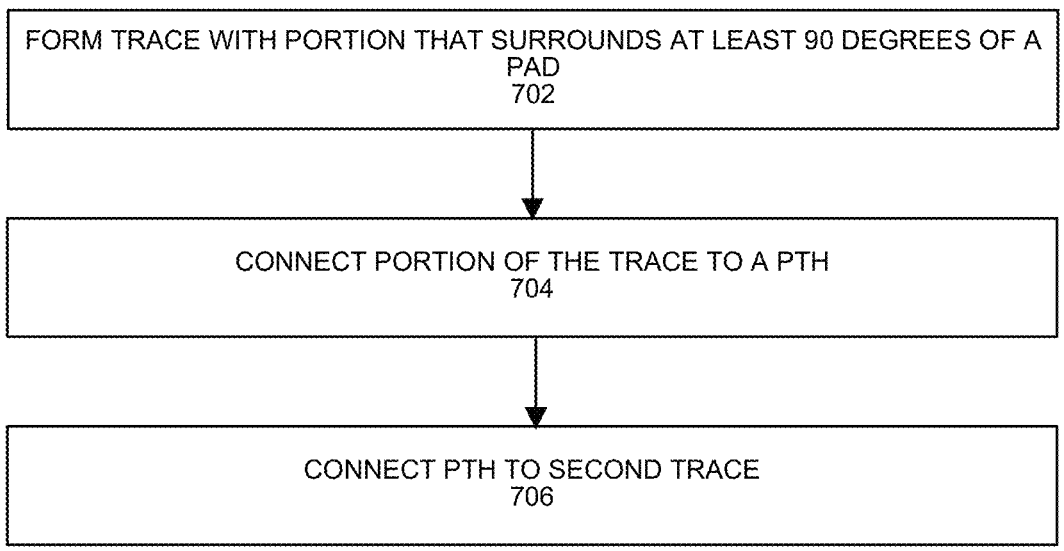
FIG. 7A depicts an example process.

FIG. 7A depicts an example process to form a trace. At 702, at least one trace with a portion of the trace that surrounds a pad to which the trace is connected can be formed. The at least one trace can be formed of a metal material such as copper, bronze, or an alloy (e.g., a combination of metals). The surrounding portion can be separated from the pad and not in contact except for a single connection region with the pad. A pad can be coupled to a ball of a BGA. The surrounding portion can encircle 180 or more degrees of the pad and be substantially planar with the pad. At 704, a portion of the trace can be connected to a Plated Through Hole (PTH). The PTH can provide conductive coupling through a substrate to second trace. At 706, the PTH portion can be connected to the second trace. The second trace can be conductively coupled to a bump on a die.

Figure 7B:
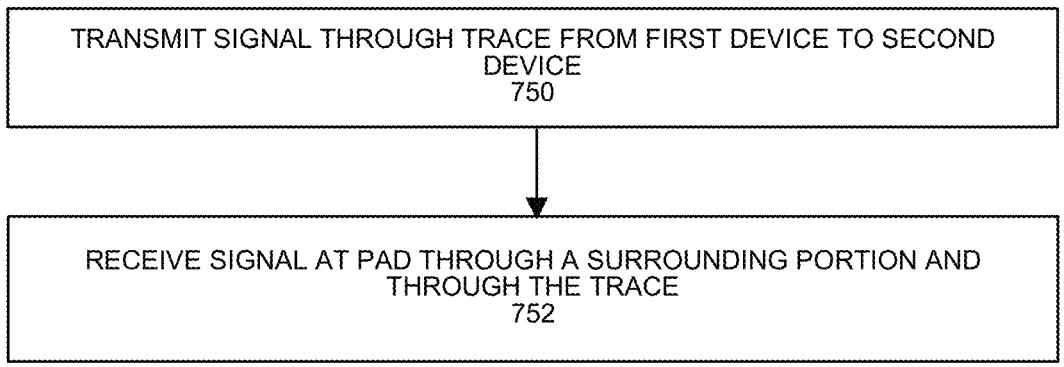
FIG. 7B depicts an example process.

FIG. 7B depicts an example process to reduce crosstalk. At 750, a signal can be provided to a trace for transmission from a first device to a second device. At 752, the signal is transmitted using a trace that transfers the signal through a portion that surrounds a portion of a pad. The surrounding portion can surround 180 or more degrees of the pad and at least a portion of the pad can be planar with the pad. For example, the pad can be coupled to a ball of a BGA and provide the signal to the second device. Note that in other examples, a signal transmitted from the pad can be transmitted through the surrounding portion of the trace and the trace from the second device to the first device.

Figure 8:
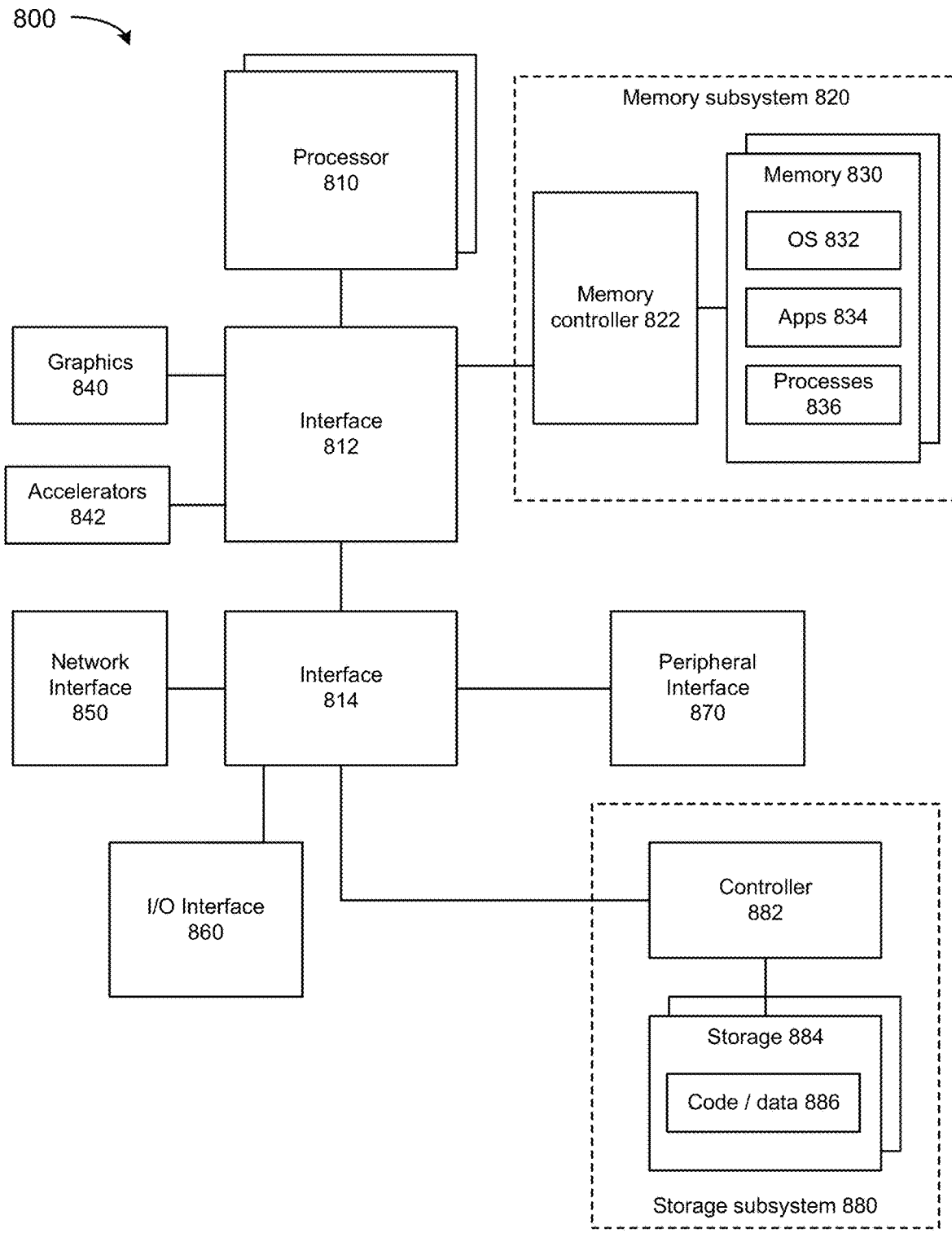
FIG. 8 depicts a system.

FIG. 8 depicts a system. The system can use embodiments described herein to reduce FEXT for signals transmitted by multiple traces from a first device to a second device. System 800 includes processor 810, which provides processing, operation management, and execution of instructions for system 800. Processor 810 can include any type of microprocessor, central processing unit (CPU), graphics processing unit (GPU), XPU, processing core, or other processing hardware to provide processing for system 800, or a combination of processors. An XPU can include one or more of: a CPU, a graphics processing unit (GPU), general purpose GPU (GPGPU), and/or other processing units (e.g., accelerators or programmable or fixed function FPGAs). Processor 810 controls the overall operation of system 800, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 800 includes interface 812 coupled to processor 810, which can represent a higher speed interface or a high throughput interface for system components that needs higher bandwidth connections, such as memory subsystem 820 or graphics interface components 840, or accelerators 842. Interface 812 represents an interface circuit, which can be a standalone component or integrated onto a processor die. Where present, graphics interface 840 interfaces to graphics components for providing a visual display to a user of system 800. In one example, graphics interface 840 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 840 generates a display based on data stored in memory 830 or based on operations executed by processor 810 or both. In one example, graphics interface 840 generates a display based on data stored in memory 830 or based on operations executed by processor 810 or both.

Accelerators 842 can be a programmable or fixed function offload engine that can be accessed or used by a processor 810. For example, an accelerator among accelerators 842 can provide compression (DC) capability, cryptography services such as public key encryption (PKE), cipher, hash/authentication capabilities, decryption, or other capabilities or services. In some embodiments, in addition or alternatively, an accelerator among accelerators 842 provides field select controller capabilities as described herein. In some cases, accelerators 842 can be integrated into a CPU socket (e.g., a connector to a motherboard or circuit board that includes a CPU and provides an electrical interface with the CPU). For example, accelerators 842 can include a single or multi-core processor, graphics processing unit, logical execution unit single or multi-level cache, functional units usable to independently execute programs or threads, application specific integrated circuits (ASICs), neural network processors (NNPs), programmable control logic, and programmable processing elements such as field programmable gate arrays (FPGAs). Accelerators 842 can provide multiple neural networks, CPUs, processor cores, general purpose graphics processing units, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 820 represents the main memory of system 800 and provides storage for code to be executed by processor 810, or data values to be used in executing a routine. Memory subsystem 820 can include one or more memory devices 830 such as read-only memory (ROM), flash memory, one or more varieties of random access memory (RAM) such as DRAM, or other memory devices, or a combination of such devices. Memory 830 stores and hosts, among other things, operating system (OS) 832 to provide a software platform for execution of instructions in system 800. Additionally, applications 834 can execute on the software platform of OS 832 from memory 830. Applications 834 represent programs that have their own operational logic to perform execution of one or more functions. Processes 836 represent agents or routines that provide auxiliary functions to OS 832 or one or more applications 834 or a combination. OS 832, applications 834, and processes 836 provide software logic to provide functions for system 800. In one example, memory subsystem 820 includes memory controller 822, which is a memory controller to generate and issue commands to memory 830. It will be understood that memory controller 822 could be a physical part of processor 810 or a physical part of interface 812. For example, memory controller 822 can be an integrated memory controller, integrated onto a circuit with processor 810.

While not specifically illustrated, it will be understood that system 800 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a Hyper Transport or industry standard architecture (ISA) bus, a small computer system interface (SCSI) bus, a universal serial bus (USB), or an Institute of Electrical and Electronics Engineers (IEEE) standard 1394 bus (Firewire).

In one example, system 800 includes interface 814, which can be coupled to interface 812. In one example, interface 814 represents an interface circuit, which can include standalone components and integrated circuitry. In one example, multiple user interface components or peripheral components, or both, couple to interface 814. Network interface 850 provides system 800 the ability to communicate with remote devices (e.g., servers or other computing devices) over one or more networks. Network interface 850 can include an Ethernet adapter, wireless interconnection components, cellular network interconnection components, USB (universal serial bus), or other wired or wireless standards-based or proprietary interfaces. Network interface 850 can transmit data to a device that is in the same data center or rack or a remote device, which can include sending data stored in memory. Network interface 850 can receive data from a remote device, which can include storing received data into memory.

In one example, system 800 includes one or more input/output (I/O) interface(s) 860. I/O interface 860 can include one or more interface components through which a user interacts with system 800 (e.g., audio, alphanumeric, tactile/touch, or other interfacing). Peripheral interface 870 can include any hardware interface not specifically mentioned above. Peripherals refer generally to devices that connect dependently to system 800. A dependent connection is one where system 800 provides the software platform or hardware platform or both on which operation executes, and with which a user interacts.

In one example, system 800 includes storage subsystem 880 to store data in a nonvolatile manner. In one example, in certain system implementations, at least certain components of storage 880 can overlap with components of memory subsystem 820. Storage subsystem 880 includes storage device(s) 884, which can be or include any conventional medium for storing large amounts of data in a non-volatile manner, such as one or more magnetic, solid state, or optical based disks, or a combination. Storage 884 holds code or instructions and data 886 in a persistent state (e.g., the value is retained despite interruption of power to system 800). Storage 884 can be generically considered to be a "memory," although memory 830 is typically the executing or operating memory to provide instructions to processor 810. Whereas storage 884 is nonvolatile, memory 830 can include volatile memory (e.g., the value or state of the data is indeterminate if power is interrupted to system 800). In one example, storage subsystem 880 includes controller 882 to interface with storage 884. In one example controller 882 is a physical part of interface 814 or processor 810 or can include circuits or logic in both processor 810 and interface 814.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). Another example of volatile memory includes cache or static random access memory (SRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/output version 2, JESD229-2 originally published by JEDEC in August 2014, HBM (High Bandwidth Memory, JESD325, originally published by JEDEC in October 2013, LPDDR5 (currently in discussion by JEDEC), HBM2 (HBM version 2), currently in discussion by JEDEC, or others or combinations of memory technologies, and technologies based on derivatives or extensions of such specifications. The JEDEC standards are available at www.jedec.org.

A non-volatile memory (NVM) device is a memory whose state is determinate even if power is interrupted to the device. In some embodiments, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), Intel® Optane™ memory, NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 800. More specifically, power source typically interfaces to one or multiple power supplies in system 800 to provide power to the components of system 800. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 800 can be implemented using interconnected compute sleds of processors, memories, storages, network interfaces, and other components. High speed interconnects can be used such as PCIe, Ethernet, or optical interconnects (or a combination thereof).

Embodiments herein may be implemented in various types of computing and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. It is noted that hardware, firmware and/or software elements may be collectively or individually referred to herein as "module," or "logic." A processor can be one or more combination of a hardware state machine, digital control logic, central processing unit, or any hardware, firmware and/or software elements.

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of steps may also be performed according to alternative embodiments. Furthermore, additional steps may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

Illustrative examples of the devices, systems, and methods disclosed herein are provided below. An embodiment of the devices, systems, and methods may include any one or more, and any combination of, the examples described below.

Flow diagrams as illustrated herein provide examples of sequences of various process actions. The flow diagrams can indicate operations to be executed by a software or firmware routine, as well as physical operations. In some embodiments, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, and so forth.

Example 1 includes an apparatus comprising: a trace comprising a portion routed at least 180 degrees around a perimeter of a pad, wherein the portion is coupled to the pad.

Example 2 includes one or more examples, wherein a cross-sectional shape of the portion routed at least 180 degrees around a perimeter of the pad is one or a combination of: circular, elliptical, square, rectangle, or triangular.

Example 3 includes one or more examples, wherein the portion routed at least 180 degrees around a perimeter of the pad is to increase package inductance and reduce a magnitude of far end cross talk (FEXT).

Example 4 includes one or more examples, wherein the portion routed at least 180 degrees around a perimeter of the pad comprises one or more of: copper, bronze, or an alloy.

Example 5 includes one or more examples, and includes a second trace comprising a second portion routed around at least a portion of a perimeter of a second pad, wherein the second portion is coupled to the second pad.

Example 6 includes one or more examples, wherein the second portion routed around at least a portion of a perimeter of the second pad is to increase package inductance and reduce a magnitude of far end cross talk (FEXT).

Example 7 includes one or more examples, wherein the trace and second trace are formed within a substrate of a printed circuit board (PCB) substrate.

Example 8 includes one or more examples, wherein the portion and the second portion are planar, the portion is planar with the pad, and the second portion is planar with the second pad.

Example 9 includes one or more examples, wherein the trace and second trace are to transmit signals from a first device to a second device.

Example 10 includes one or more examples, wherein the first device comprises a memory device and the second device comprises one or more of: central processing unit (CPU), XPU, graphics processing unit (GPU), or accelerator device.

Example 11 includes one or more examples, and includes a method comprising: coupling a conductor to a pad, wherein the conductor include a portion that surrounds a portion of the pad and coupling a second conductor to a second pad, wherein the conductor include a portion that surrounds a portion of the second pad, wherein the portion and second portion are planar and positioned between the pad and the second pad.

Example 12 includes one or more examples, wherein: a cross-sectional shape of the portion is one or a combination of: circular, elliptical, square, rectangle, or triangular and a cross-sectional shape of the second portion is one or a combination of: circular, elliptical, square, rectangle, or triangular.

Example 13 includes one or more examples, wherein: the portion and the second portion are to increase package inductance and reduce a magnitude of far end cross talk (FEXT).

Example 14 includes one or more examples, wherein: the portion comprises one or more of: copper, bronze, or an alloy and the second portion comprises one or more of: copper, bronze, or an alloy.

Example 15 includes one or more examples, wherein: the conductor and the second conductor are to transmit signals from a first device to a second device.

Example 16 includes one or more examples, wherein: the first device comprises a memory device and the second device comprises one or more of: central processing unit (CPU), XPU, graphics processing unit (GPU), or accelerator device.

Example 17 includes one or more examples, and includes a system comprising: a first device comprising a memory device; a second device; a circuit board; a pad and second pad coupled to the second device; a trace formed, at least partially, within the circuit board, the trace comprising a portion routed around at least a portion of a perimeter of the pad, wherein the portion is coupled to the pad; and a second trace formed, at least partially, within the circuit board, the second trace comprising a second portion routed around at least a portion of a perimeter of the second pad, wherein the second portion is coupled to the second pad and wherein the portion and the second portion are planar, the portion is planar with the pad, and the second portion is planar with the second pad.

Example 18 includes one or more examples, wherein a cross-sectional shape of the portion is one or a combination of: circular, elliptical, square, rectangle, or triangular.

Example 19 includes one or more examples, wherein the portion is to increase package inductance and reduce a magnitude of far end cross talk (FEXT).

Example 20 includes one or more examples, wherein the portion comprises one or more of: copper, bronze, or an alloy.

What is claimed is:

1. An apparatus comprising:
   a trace comprising a portion routed at least 180 degrees around a perimeter of a pad, wherein the portion is coupled to the pad and
   a second trace comprising a second portion routed around a portion of a perimeter of a second pad, wherein the second portion is coupled to the second pad, wherein:
   a cross-sectional shape of the portion routed at least 180 degrees around the perimeter of the pad is circular,
   the second portion is routed around at least 180 degrees around the perimeter of the second pad in a circular shape to increase package inductance and reduce a magnitude of far end cross talk (FEXT),
   a top surface of the portion and a top surface of the second portion are planar,
   a top surface of the portion is planar with a top surface of the pad, and
   a top surface of the second portion is planar with a top surface of the second pad.

2. The apparatus of claim 1, wherein the cross-sectional shape of the portion routed at least 180 degrees around a perimeter of the pad is one or a combination of: circular, elliptical, square, rectangle, or triangular.

3. The apparatus of claim 1, wherein the portion routed at least 180 degrees around a perimeter of the pad comprises one or more of: copper, bronze, or an alloy.

4. The apparatus of claim 1, wherein the trace and the second trace are formed within a substrate of a printed circuit board (PCB) substrate.

5. The apparatus of claim 1, wherein the trace and the second trace are to transmit signals from a first device to a second device.

6. The apparatus of claim 5, wherein
   the first device comprises a memory device and
   the second device comprises one or more of: central processing unit (CPU), XPU, graphics processing unit (GPU), or accelerator device.

7. The apparatus of claim 1, wherein the portion is routed at least 270 degrees around the perimeter of the pad and the second portion is routed at least 270 degrees around the perimeter of the second pad.

8. A system comprising:
   a first device comprising a memory device;
   a second device;
   a circuit board;
   a pad and second pad coupled to the second device;
   a trace formed, at least partially, within the circuit board, the trace comprising a portion routed t least 180 degrees around a perimeter of the pad, wherein the portion is coupled to the pad and wherein a cross-sectional shape of the portion routed at least 180 degrees around the perimeter of the pad is circular; and
   a second trace formed, at least partially, within the circuit board, the second trace comprising a second portion routed at least 180 degrees around a perimeter of the second pad, wherein the second portion is coupled to the second pad and the second portion routed around at least 180 degrees around the perimeter of the second pad is to increase package inductance and reduce a magnitude of far end cross talk (FEXT), and wherein:
   a top surface of the portion and a top surface of the second portion are planar,
   a top surface of the portion is planar with a top surface of the pad, and
   a top surface of the second portion is planar with a top surface of the second pad.

9. The system of claim 8, wherein the cross-sectional shape of the portion is one or a combination of: circular, elliptical, square, rectangle, or triangular.

10. The system of claim 8, wherein the portion is to increase package inductance and reduce a magnitude of far end cross talk (FEXT).

11. The system of claim 8, wherein the portion comprises one or more of: copper, bronze, or an alloy.

* * * * *